(12) United States Patent
Penninckx et al.

(10) Patent No.: US 10,476,225 B2
(45) Date of Patent: Nov. 12, 2019

(54) INJECTED LASER AND METHOD FOR GENERATING LONGITUDINAL MULTIMODE LASER PULSES

(71) Applicant: COMMISSARIAT A L'ENERGIE ATOMIQUE ET AUX ENERGIES ALTERNATIVES, Paris (FR)

(72) Inventors: Denis Penninckx, Cestas (FR); Jacques Luce, Gujan-Mestras (FR); Romain Diaz, Talence (FR); Odile Bonville, Cabanac (FR); Roger Courchinoux, Gradignan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/739,182

(22) PCT Filed: Jul. 6, 2016

(86) PCT No.: PCT/FR2016/051714
§ 371 (c)(1),
(2) Date: Dec. 22, 2017

(87) PCT Pub. No.: WO2017/009542
PCT Pub. Date: Jan. 19, 2017

(65) Prior Publication Data
US 2018/0183203 A1 Jun. 28, 2018

(30) Foreign Application Priority Data

Jul. 10, 2015 (FR) ...................................... 15 01472

(51) Int. Cl.
*H01S 3/08* (2006.01)
*H01S 3/131* (2006.01)
(Continued)

(52) U.S. Cl.
CPC ........ *H01S 3/1312* (2013.01); *H01S 3/08022* (2013.01); *H01S 3/094042* (2013.01);
(Continued)

(58) Field of Classification Search
CPC .. H01S 3/1312; H01S 3/139; H01S 3/094042; H01S 5/0687; H01S 3/08022;
(Continued)

(56) References Cited

U.S. PATENT DOCUMENTS

| 5,027,360 A | 6/1991 | Nabors et al. |
| 6,580,532 B1 * | 6/2003 | Yao ........................... H03L 7/04 372/29.011 |

(Continued)

OTHER PUBLICATIONS

Fujii Y et al.: "Dual-Frequency Pulsed Laser With an Accurate Gigahertz-Beat Note", Optics Letters, Optical Society of America, US, vol. 32, No. 21, Nov. 1, 2007 (Nov. 1, 2007), pp. 3065-3067, XP001509586, ISSN: 0146-9592, DOI: 10.1364/OL.32.003065.
(Continued)

*Primary Examiner* — Yuanda Zhang
(74) *Attorney, Agent, or Firm* — Young & Thompson

(57) ABSTRACT

Disclosed is an injected laser including an optical amplifying medium arranged inside a triggered laser cavity, the optical amplifying medium having a spectral amplifying band. The injected laser includes an optical phase-modulation device, arranged between the injection source and the laser cavity, the optical phase-modulation device being configured to periodically modulate as a function of time a phase of the monochromatic continuous laser radiation at a modulation frequency equal to a natural integer multiple of the free spectral range of the laser cavity, so that the phase-modulated injection source generates a polychromatic injection radiation.

16 Claims, 2 Drawing Sheets

Figure 6:
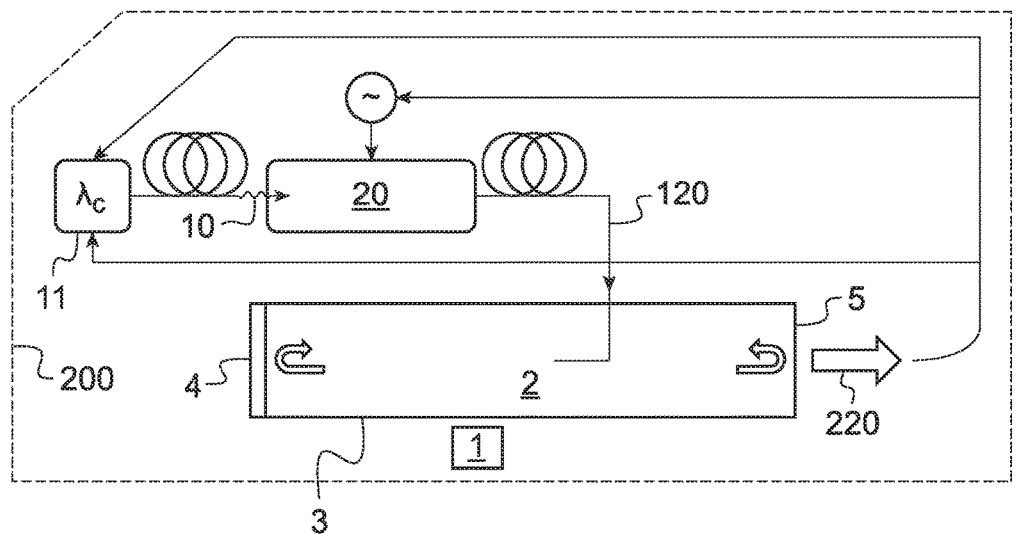

(51) Int. Cl.
*H01S 3/10* (2006.01)
*H01S 3/13* (2006.01)
*H01S 3/16* (2006.01)
*H01S 5/0687* (2006.01)
*H01S 3/094* (2006.01)
*H01S 3/139* (2006.01)
*H01S 5/024* (2006.01)
*H01S 5/068* (2006.01)
*H01S 3/0941* (2006.01)
*H01S 3/11* (2006.01)

(52) U.S. Cl.
CPC ........ *H01S 3/10092* (2013.01); *H01S 3/1305* (2013.01); *H01S 3/139* (2013.01); *H01S 3/1611* (2013.01); *H01S 3/1643* (2013.01); *H01S 5/0687* (2013.01); *H01S 3/0941* (2013.01); *H01S 3/11* (2013.01); *H01S 3/1307* (2013.01); *H01S 5/02415* (2013.01); *H01S 5/06808* (2013.01); *H01S 2301/03* (2013.01)

(58) Field of Classification Search
CPC .. H01S 3/1643; H01S 3/10092; H01S 3/1611; H01S 3/1305; H01S 3/0941; H01S 3/11; H01S 3/1307; H01S 5/02415; H01S 2301/03; H01S 5/06808
See application file for complete search history.

(56) References Cited

U.S. PATENT DOCUMENTS

2004/0233945 A1  11/2004  Komine et al.
2011/0037985 A1* 2/2011  Qiu ..................... G01C 19/72
                                                                356/461

OTHER PUBLICATIONS

Raymond T D et al.: "Two-Frequency Injection-Seeded Nd: YAG Laser", IEEE Journal of Quantum Electronics, IEEE Service Center, Piscataway, NJ, USA, vol. 31, No. 10, Oct. 1, 1995 (Oct. 1, 1995), pp. 1734-1737, XP000536234, ISSN: 0018-9197, DOI: 10.1109/3.466046.

Daniel et al.: "Development of an amplitude-modulated Nd:YAG pulsed laser with modulation frequency tunability up to 60 GHz by dual seed injection", Jun. 1, 2004 / vol. 29, No. 11 / Optics Letters pp. 1203-1205.

Masayuki et al.: "Dual-wavelength injection-locked pulsed laser", Sep. 15, 2005 / vol. 30, No. 18 / Optics Letters 2421-2423.

Tsuguhito Nakano et al.: "Dual-frequency injection-locked nano-second pulsed laser with arbitrary combination of two oscillation frequencies", Dec. 6, 2010 / vol. 18, No. 25 / Optics Express 26409-26416.

Y. K. Park et al.: "Stable single-axial-mode operation of an unstable-resonator Nd:YAG oscillator by injection locking", Optics Letters / vol. 5, No. 3 / Mar. 1980, 96-98.

International Search Report, dated Nov. 2, 2016, from corresponding PCT/FR2016/051714 application.

* cited by examiner

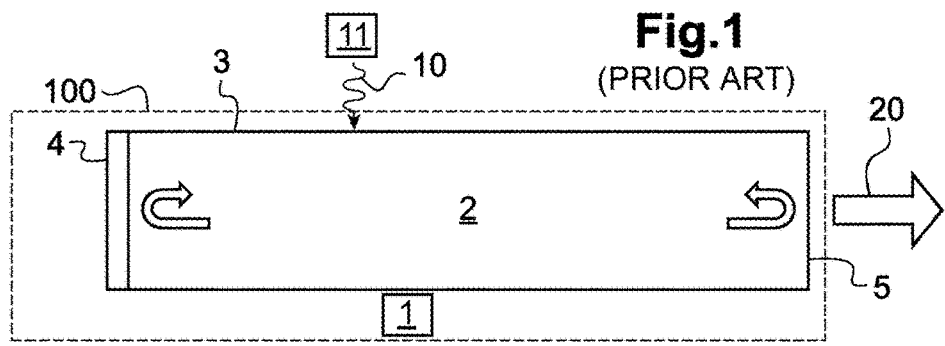
Fig.1
(PRIOR ART)
Fig.2A Fig.2B Fig.2C
(PRIOR ART)
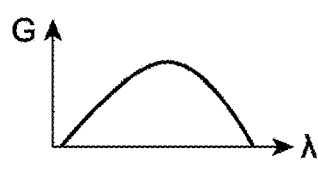 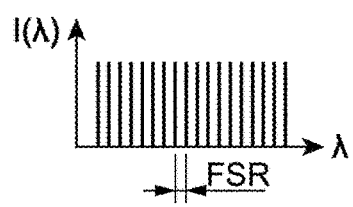 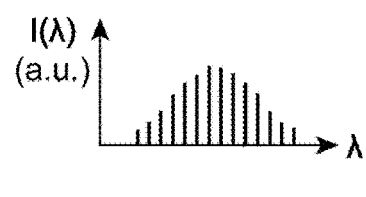
Fig.3A Fig.3B Fig.3C
(PRIOR ART)
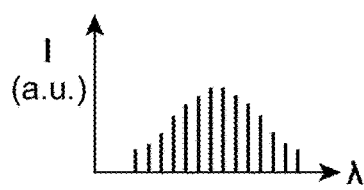 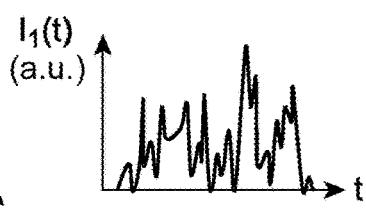 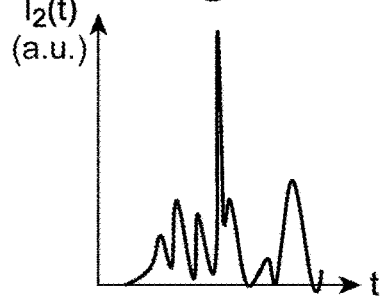
Fig.4
(PRIOR ART)
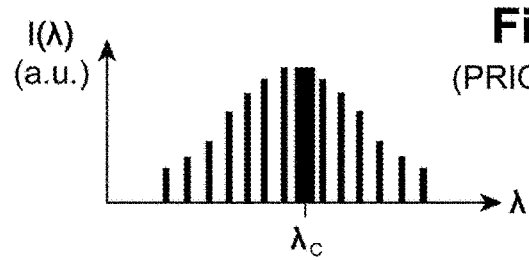
Fig.5A Fig.5B Fig.5C
(PRIOR ART)
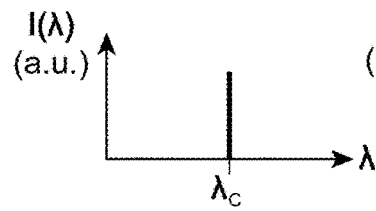  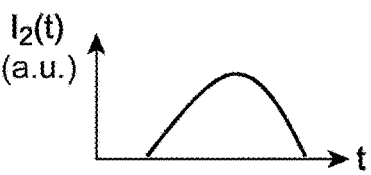

INJECTED LASER AND METHOD FOR GENERATING LONGITUDINAL MULTIMODE LASER PULSES

TECHNICAL FIELD TO WHICH THE INVENTION RELATES

The present invention generally relates to the field of devices using stimulated emission.

It more particularly relates to the field of lasers for producing and amplifying electro-magnetic waves in the ultraviolet, visible and/or infrared spectral field.

It relates in particular to a laser configured to provide high-energy laser pulses having a stable intensity and a temporal intensity profile without intensity modulation peak and reproducible over time.

TECHNOLOGICAL BACK-GROUND

In the present document, it is meant by single-longitudinal mode laser radiation a monochromatic laser radiation and by multi-longitudinal mode laser radiation a polychromatic laser radiation, respectively.

FIG. 1 schematically shows a laser source 100 according to the prior art. The laser source 100 comprises a pumping energy source 1, an optical amplifying medium 2 and a resonating cavity 3. The optical amplifying medium 2 is a medium adapted to absorb the energy of the pumping energy source 1 by exciting atoms (for example rare earth ions, such as neodymium, ytterbium or erbium ions) and that may generate, by stimulated emission, an amplified light radiation. The optical amplifying medium 2 has generally a spectral range of amplification, also called gain band $G(\lambda)$ (illustrative example in FIG. 2A). Only the wavelengths located within this gain band $G(\lambda)$ are amplified. The amplification can be produced naturally from the photon noise. The laser cavity 3 includes two ends 4, 5 between which the radiation performs one or several round trips to be progressively amplified. The laser cavity 3 defines, among the wavelengths of the gain band, those which have a substantial gain over several round trips in the laser cavity 3. Those discrete wavelengths are called resonance modes or longitudinal modes of the laser cavity 3. Indeed, the resonating cavity 3 amplifies selectively certain optical frequencies (or the corresponding wavelengths) and hence emits a coherent light radiation. More precisely, the resonating cavity 3 determines wavelengths that are regularly spaced apart by a free spectral range (FSR). FIG. 2B schematically shows the intensity I of the longitudinal modes of the resonating cavity 3 as a function of the wavelength $\lambda$. Unlike a light-emitting diode (LED) that does not include a resonating cavity 3 and that emits a non-coherent radiation, a laser diode includes a resonating cavity 3 and emits a coherent radiation.

To generate laser pulses, a triggering means is generally used. In a manner know per se, the laser may be triggered passively or actively, for example by means of a Q-switch.

By way of example, the neodymium-YAG (Nd:YAG) lasers are capable of delivering nanosecond laser pulses of a few Joules at a high rate and at a wavelength of 1064 nm. The Nd:YAG lasers are often doubled, tripled or even quadrupled in frequency to obtain laser pulses at a wavelength of 532 nm, 355 nm or 266 nm, respectively. These lasers serve in the industry for various applications. The Nd:YAG lasers have two operation modes: non-injected and injected.

In non-injected mode (illustrated in FIG. 2-3), the cavity laser does not include an injection source 11, but only an amplifying medium 2, whose gain band $G(\lambda)$ is schematically shown in FIG. 2A, and a resonating cavity 3, whose resonance frequency spectrum is schematically shown in FIG. 2B. The laser pulses are constructed from the photon noise. FIG. 2C schematically shows the spectral intensity $I(\lambda)$ of a laser pulse at the exit of a non-injected mode laser. In practice, all the longitudinal modes of the laser cavity (FIG. 2C) located inside the gain band $G(\lambda)$ of the amplifier 2 (FIG. 2A) end up in the output laser pulse. The output wavelengths are regularly spaced apart in frequency by the free spectral range of the cavity. The non-injected cavity laser hence emits a multi-longitudinal mode radiation 20, having a spectrum consisted of the longitudinal modes of the laser cavity. Hence, most of the laser sources, having for example an energy of the order of a few Joules and comprising no specific filtering means, emit a multi-longitudinal mode radiation. However, in the case of a pulse laser radiation, for example of a duration of the order of a few nanoseconds, the multimode pulses produced have generally a temporal intensity profile that is randomly noisy and non-reproducible from one pulse ($I_1(t)$ FIG. 3B) to another pulse ($I_2(t)$ FIG. 3C). These intensity profiles $I(t)$ show high variations as a function of time, making appear modulations or peaks of intensity. These temporal intensity profiles $I(t)$ are not limited by the Fourier transform.

The injection signal is modulated only in phase.

Now, exposing a material to a laser pulse showing such peaks of intensity may cause undesirable non-linear effects, in particular a Kerr-induced self-focusing of the pulse in the material.

If a monochromatic laser source is desired, it is advisable to favour the amplification of a laser line at a determined wavelength $\lambda_0$.

Different methods exist to obtain a monochromatic laser. The first method consists in spacing apart the optical frequencies of the cavity so that it remains only one frequency in the gain band of the amplifying medium. This is realisable only in a cavity of extremely small dimension, limited to the generation of a low-energy radiation, for example a laser diode. A second method consists in arranging filtering means, such as a dispersive element, for example a diffraction grating, for filtering a specific wavelength, which complicates the laser.

Another known method consists in using the injected mode cavity laser. For that purpose, a generally continuous, monochromatic and low-power injection source 11 is used to inject a source signal 10 into the cavity laser.

In particular, the document Y. K. Park et al., "Stable single-axial mode operation of an unstable-resonator Nd:YAG oscillator by injection locking", Optics Letters, Vol. 5, pp. 96-98, 1980, is known. The injection source 11 is a monochromatic, low-power, continuous laser, whose wavelength $\lambda_0$ is tuned with one of the longitudinal modes of the resonating cavity 3 of the Nd-YAG laser (see FIG. 4). The initial power level of this particular mode is then far higher than that of all the other modes that are at the level of the photons noise. The amplified laser pulses have a very narrow spectrum in the vicinity of the wavelength $\lambda_0$ of the injection source. Using a monochromatic injection source hence allows selecting a longitudinal cavity mode and making a cavity laser single-longitudinal mode. At the exit of the laser cavity, almost-monochromatic laser pulses (spectral intensity $I(\lambda)$ FIG. 5A) having a stable intensity, in other words a temporal shape limited by the Fourier transform, without peak, and having a temporal intensity profile that is reproducible from one laser pulse ($I_1(t)$ FIG. 5B) to another laser pulse ($I_2(t)$ FIG. 5C) are obtained.

In the application to the thick material damaging tests, it is desirable to generate very energetic laser pulses, of the order of several Joules, to go up to the break of the material. However, a very high energy may cause important non-linear propagation effects. Now, in conventional injected mode, the pulses being almost monochromatic, the stimulated Brillouin scattering backscatters a great part of the pulse even before the latter has passed through the tested material. On the other hand, in non-injected mode, the temporal fluctuations induce Kerr-induced self-focusing.

For certain applications, it is hence desirable to have high-energy laser pulses while avoiding the undesirable non-linear effects of stimulated Brillouin backscattering and of Kerr-induced self-focusing. It is hence desirable to generate high energy laser pulses having, firstly, an extended spectrum to avoid the stimulated Brillouin scattering, secondly, each laser pulse having a temporal intensity profile without peak of intensity, i.e. a stable intensity during each pulse to avoid the Kerr-induced self-focusing, and thirdly, these laser pulses having a temporal intensity profile reproducible from one pulse to another.

An injection laser is known, using two independent injection lasers having two distinct wavelengths tuned on different longitudinal modes of the laser cavity, respectively (see for example the publications T. Raymond and A. Smith, "Two-frequency injection-seeded Nd:YAG laser", IEEE Journal of Quantum Electronics, Vol. 31, pp. 1734-1737, 1995; D. C. Kao et al., "Development of an amplitude-modulated Nd:YAG pulsed laser with modulation frequency tunability up to 60 GHz by dual seed injection", Optics Letters, Vol. 29, pp. 1203-1205, 2004; M. Katsuragawa and T. Onose, "Dual-wavelength injection-locked pulsed laser", Optics Letters, Vol. 30, pp. 1421-1423, 2005; T. Nakano et al., "Dual-frequency injection-locked nanosecond pulsed laser with arbitrary combination of two oscillation frequencies", Optics Express, Vol. 18, pp. 26409-26416, 2010). However, each output laser pulse has an intensity $I(t)$ as a function of time that is very highly periodically modulated due to the beat between the two injection lasers. These intensity modulation peaks in the output laser pulses are liable to cause undesirable non-linear effects. Moreover, the beat drifts generate variations from one pulse to the other.

On the other hand, an injection laser is known, using an injection module consisted of a single continuous laser in which the intensity of this single injection laser source is modulated as a function of time. Hence, the publication Y. Fujii, and M. Katsuragawa, "Dual-frequency pulsed laser with an accurate gigahertz-beat note," Optics Letters, Vol. 32, pp. 3065-3067, 2007 describes a sinusoidal modulation of the intensity of the injection source at a modulation frequency equal to half the free spectral interval between two modes of the cavity. This modulation of intensity of the injection source allows obtaining output laser pulses having at most two or three longitudinal modes. However, also in this case, the laser pulses generated have an intensity whose temporal profile $I(t)$ is highly modulated as a function of time inside a pulse. These intensity modulation peaks in the output laser pulses are liable to cause Kerr-induced self-focusing.

It is desired to generate high-energy and/or high-power laser pulses to test the strength of materials or optical components relative to a damaging by these laser pulses.

For that purpose, it is desired to generate high-energy laser pulses, while limiting the risk of generating or undergoing undesirable non-linear effects: the Kerr effect and the stimulated Brillouin scattering during an interaction between these laser pulses and a material.

OBJECT OF THE INVENTION

In order to remedy the above-mentioned drawback of the state of the art, the present invention proposes an injected laser comprising an optical amplifying medium arranged inside a triggered laser cavity, the optical amplifying medium having a spectral amplification band, the laser cavity having a free spectral range lower than the spectral bandwidth of the optical amplifying medium, the laser cavity determining longitudinal resonance modes spectrally separated by the free spectral range.

More particularly, it is proposed according to the invention an injected laser comprising a single injection source adapted to emit a monochromatic continuous laser radiation, the injected laser comprising an optical phase-modulation device arranged between the injection source and the laser cavity, the optical phase-modulation device being configured to periodically modulate as a function of time a phase of the monochromatic continuous laser radiation at a modulation frequency equal to a natural integer multiple of the free spectral range of the laser cavity, so that the phase-modulated injection source generates a polychromatic injection radiation having a plurality of discrete wavelengths located inside the gain band of the optical amplifier, the plurality of discrete wavelengths being tuned over a plurality of longitudinal resonance modes of the laser cavity, the laser cavity and the optical amplifying medium being adapted to receive said polychromatic injection radiation and to generate a multi-longitudinal mode laser pulse.

The injected laser hence generates laser pulses having, on the one hand, an extended spectrum and, on the other hand, an intensity stable over time. The spectrum of the laser pulses is extended over several discrete wavelengths, spaced apart from each other by an integer multiple of the FSR. Each pulse of a temporal intensity profile devoid of peaks of intensity or over-modulation. These multi-longitudinal mode pulses have a temporal intensity profile stable over time and reproducible from one pulse to the other.

The number of discrete wavelengths and their relative intensity may be adjusted according to the needs as a function of the phase modulation applied.

The laser hence allows delivering high-energy pulses while avoiding generating and undergoing undesirable non-linear effects during an interaction between these laser pulses and a material.

Other non-limitative and advantageous characteristics of the injected laser according to the invention, taken individually or according to all the technically possible combinations, are the following:

- the optical phase-modulation device is configured to sinusoidally modulate the phase of the monochromatic continuous laser radiation as a function of time with a modulation depth m, so that the polychromatic injection radiation includes about (2·m+1) discrete wavelengths;
- the modulation depth is equal to about 1.4 radian so that the polychromatic injection radiation includes about three discrete wavelengths;
- the injected laser comprises a feedback-loop servo-control system comprising a measurement system adapted to measure a signal representative of a multi-longitudinal mode laser pulse at the exit of the laser cavity and a control device to modify, as a function of the signal measured, at least one parameter of operation of the injection source and/or of the optical phase-modulation device and/or of the laser cavity;

the injection source comprises a laser diode supplied by an electric current source and the feedback system comprises a device adapted to modify the power of the electric current source supplying the laser diode, so as to modify the wavelength of the monochromatic continuous laser radiation as a function of the signal measured, so that the wavelength of the monochromatic continuous laser radiation corresponds to a longitudinal mode of the laser cavity;

the feedback loop system comprises a device adapted to modify the modulation frequency and/or the modulation depth of the optical phase-modulation device as a function of the signal measured;

the optical amplifying medium is chosen among a material having a titanium-, ytterbium- or neodymium-doped matrix, for example a neodymium-YAG crystal or a titanium-sapphire crystal;

the laser cavity comprises a Q-switch pulse triggering device;

the injection source is a fibred laser diode emitting a monochromatic continuous laser radiation at a wavelength of 1064 nm, the optical phase-modulation device comprises an optical modulator with a waveguide integrated on a lithium niobate substrate, the optical amplifying medium is a neodymium-YAG crystal and the triggered laser cavity comprises a Q-switch triggering device.

The invention also proposes a method for generating multi-longitudinal mode laser pulses comprising the following steps:

emission of a monochromatic continuous laser radiation, periodic modulation, as a function of time, at a modulation frequency, of a phase of the monochromatic continuous laser radiation so as to generate a polychromatic injection radiation having a plurality of discrete wavelengths, injection of the polychromatic injection radiation in a triggered laser cavity comprising an optical amplifying medium arranged inside the laser cavity, the optical amplifying medium having a spectral amplification band, and the laser cavity having a free spectral band lower than the spectral bandwidth of the optical amplifying medium, the modulation frequency being equal to a natural integer multiple of the free spectral band of the laser cavity, so that the plurality of discrete wavelengths of the polychromatic injection radiation is tuned over a plurality of longitudinal resonance modes of the laser cavity located inside the gain band of the optical amplifier, amplification of the polychromatic injection radiation in the triggered laser cavity, and triggering of the emission of a multi-longitudinal mode laser pulse.

DETAILED DESCRIPTION OF AN EMBODIMENT

The following description in relation with the appended drawings, given by way of non-limitative examples, will allow a good understanding of the invention and of how it can be implemented.

Figure 7A:
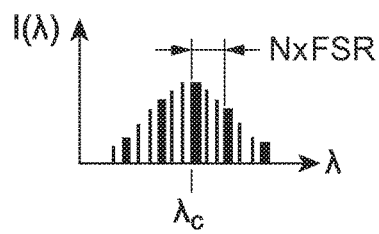
Figure 7B:
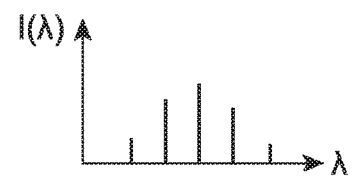
Figure 7C:
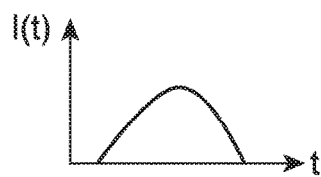
Figure 8:
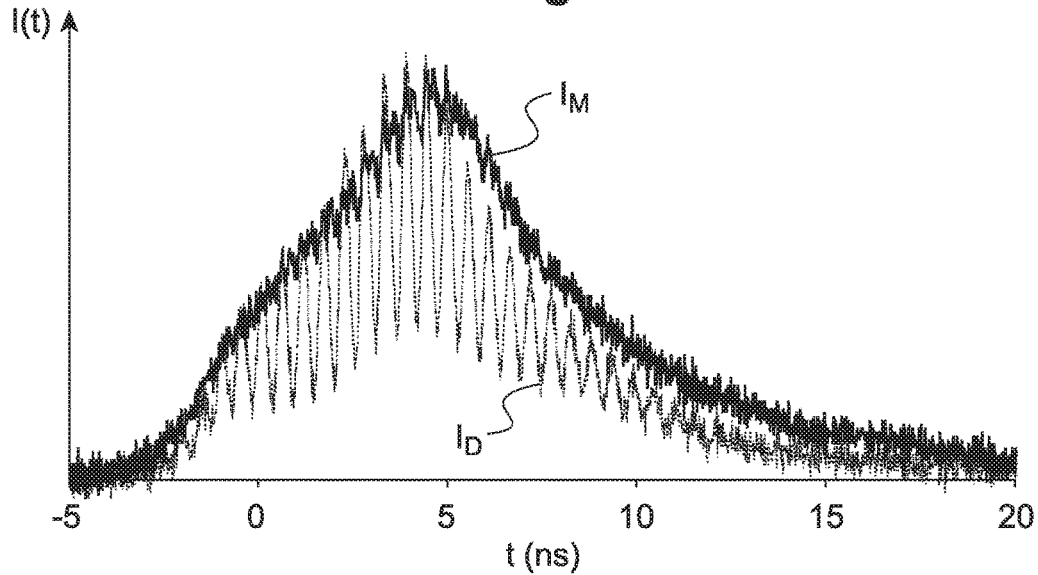

On the appended drawings:

FIG. 1 schematically shows a cavity laser according to the prior art;

FIG. 2 schematically shows the spectral response of a non-injected mode cavity laser; FIG. 2A illustrates the gain of an optical amplifying medium as a function of the wavelength $G(\lambda)$; FIG. 2B illustrates the longitudinal resonance modes of a laser cavity; and FIG. 2C schematically shows the spectral intensity $I(\lambda)$ of a non-injected cavity laser;

FIG. 3A schematically shows the spectral intensity $I(\lambda)$ of a non-injected cavity laser of the prior art; FIG. 3B, respectively 3C, shows the temporal intensity profile $I_1(t)$ of a first laser pulse, $I_2(t)$ of a second laser pulse, respectively, at the exit of this non-injected cavity laser of the prior art;

FIG. 4 schematically shows an injection wavelength tuned on a resonance mode of an injected mode laser of the prior art;

FIG. 5A schematically shows the almost-monochromatic spectral intensity $I(\lambda)$ of an injected cavity laser of the prior art, FIG. 5B, respectively 5C, shows the temporal intensity profile $I_1(t)$ of a first almost-monochromatic laser pulse, $I_2(t)$ of a second laser pulse, respectively, at the exit of this injected cavity laser of the prior art;

FIG. 6 schematically shows an injected laser according to an embodiment of the invention;

FIG. 7A schematically shows the spectral intensity $I(\lambda)$ of a phase-modulated injection source, in superposition with the spectrum of a cavity laser; FIG. 7B shows the spectral intensity of a laser pulse at the exit of a multi-longitudinal mode laser injected by a phase-modulated injection source; and FIG. 7C shows a temporal intensity profile $I_1(t)$ of a multi-longitudinal mode laser pulse at the exit of this cavity laser injected by a phase-modulated injection source;

FIG. 8 shows a measurement of laser pulse spectral intensity at the exit of a laser cavity injected by a detuned phase-modulated injection source and by a tuned phase-modulated injection source, respectively, on longitudinal modes of the laser cavity.

The present disclosure proposes a multi-longitudinal mode pulse laser that allows eliminating the numerous undesirable non-linear effects during the laser-material interactions.

Indeed, different undesirable non-linear effects, in particular the Stimulated Brillouin scattering (BS) and/or the Kerr effect, are liable to occur during interactions between a material and laser pulses.

The Stimulated Brillouin scattering (BS) is a non-linear effect that results from an excitation of the resonances in the crystal of a material subjected to a laser radiation. This non-linear effect appears as a function of the power spectral density, for a same energy. There exists a Brillouin width, also called Brillouin characteristic time, that depends on each material and on the incident wavelength.

The Kerr effect is a non-linear effect linked to the intensity of the laser pulse and induces a modification of the refractive index of the material. The Kerr effect is liable to induce the formation of a lens in the material producing a self-focusing of the laser beam.

The present disclosure allows reducing the risks of non-linear effects liable to appear and to hamper the tests of strength of the materials to the laser effects.

Device

In FIG. 6 is shown an injected laser 200 according to an embodiment of the invention.

The injected laser 200 comprises a single one injection source 11. Preferably, this source comprises a temporally continuous laser source. The injection source 11 emits a monochromatic continuous laser radiation 10 at a wavelength $\lambda_c$.

The injection source 11 is for example a fibred laser diode of wavelength $\lambda_c$ equal to 1064.2 nm. The laser diode emits a continuous radiation and a power of the order of a few milliwatts to a few tens of milliwatts.

The laser 200 comprises an optical amplifying medium 2 arranged inside a laser cavity 3 that is triggered, generally by a Q-switch. The wavelength $\lambda_c$ of the injection source 11 is selected in the gain band of the optical amplifying medium 2 and preferably in the vicinity of a longitudinal mode of the laser cavity 3.

Moreover, the injected laser 200 comprises an optical phase modulator 20 arranged between the injection source 11 and the laser cavity 3. The optical phase modulator 20 is excited at a modulation frequency $f_m$ and with a determined depth or modulation amplitude m.

The most current shape of the periodic phase modulation is of the sinusoidal type, without synchronisation. In the case of a sinusoidal modulation, the phase modulation follows the equation:

$$\phi(t) = m \cdot \sin(2\pi \cdot f_m \cdot t)$$

As an alternative, any other shape of periodic modulation may be applied, such as a square, triangular or sawtooth shape.

By way of example, the optical phase modulator 20 is a modulator with a waveguide integrated on a lithium niobate substrate ($LiNbO_3$). The application of a modulation voltage between the electrodes of the integrated module allows controlling a phase-shift modulated as a function of time. For example, the modulation voltage may be sinusoidal, at a modulation frequency $f_m$ in the radio-frequency range (rf), of the order of several hundreds of megahertz. The amplitude of the voltage applied determines the modulation depth m. For example, a voltage applied of 5-6 volts of amplitude on a modulator with an integrated waveguide allows obtaining a modulation depth m=1.4 radian so as to modulate the phase between −1.4 radian and +1.4 radian.

The optical phase modulator 20 is arranged between the injection source 11 and the laser cavity 3 on an optical path of the monochromatic continuous laser radiation 10.

The optical phase modulator 20 modulates the phase of the monochromatic continuous laser radiation 10 of wavelength $\lambda_c$. Herein, the optical phase modulator 20 does not modulate the intensity of the monochromatic continuous laser radiation 10. Hence, the intensity of the injection radiation remains stable as a function of time.

At the exit of the optical phase modulator 20, it is obtained an injection radiation 120 that is temporally continuous and phase modulated at the modulation frequency $f_m$. In the spectral domain, by application of a Fourier transform, the continuous and phase-modulated injection radiation 120 has a plurality of discrete wavelengths and hence forms an injection radiation that is both temporally continuous and polychromatic 120.

The number of spectral lines, their respective wavelengths and the relative intensity of the spectral lines at the discrete wavelengths of the phase-modulated continuous injection radiation 120 are function of the wavelength $\lambda_c$ of the monochromatic continuous laser radiation 10, of the modulation frequency $f_m$ and of the modulation depth m.

More precisely, it is considered a phase modulator applying a sinusoidal modulation at a modulation frequency $f_m$ in the domain of the megahertz (MHz) to the gigahertz (GHz) with a modulation depth m. The phase modulator generates Bessel lines in the spectrum of the injection radiation 120. The number of lines and the relative height of the lines are function of the modulation depth m. The number of lines is approximately equal to (2·m+1). These spectral lines are distributed about the wavelength $\lambda_c$ of the continuous laser radiation. These spectral lines are spaced apart from each other, in the domain of the optical frequencies, by the modulation frequency $f_m$.

A first particularly interesting exemplary embodiment corresponds to the value of the modulation depth m=1.4 rad. Indeed, this first particular value allows generating essentially three main spectral lines and two related spectral lines of lower intensity, the other Bessel lines being of almost-null intensity. The three main spectral lines are equal in intensity, the central line being centred to the wavelength $\lambda_c$ and the three main lines being spaced apart in optical frequency from the modulation frequency $f_m$. It is reminded that the optical frequency f is linked to the wavelength λ by the well-known relation:

$$f = \frac{c}{\lambda}$$

where c represents the celerity of light.

A second interesting exemplary embodiment corresponds to the value of the modulation depth m=2.4 rad. This second particular value allows cancelling the central line and generating in total about six lines, spaced apart in optical frequency by the modulation frequency $f_m$ and arranged symmetrically with respect to this central line. The central line of null intensity is located at the wavelength $\lambda_c$ of the monochromatic injection source 11.

In another example, a value of the modulation depth m=10 radians allows generating about 21 spectral lines.

It is noted that it is not necessary that the discrete lines are equidistant from each other. It is possible that one or several lines are cancelled between two discrete lines. Likewise, it is not necessary that the discrete lines correspond to all the longitudinal modes of the cavity located inside the spectral band of the amplifier. According to the applications, at least two or three lines tuned at longitudinal modes and located in the gain band of the optical amplifier are sufficient.

The polychromatic lines are selected so that they coincide with longitudinal modes of the laser cavity and so that they are located inside the gain band of the optical amplifier.

For that purpose, a first condition is to choose the modulation frequency $f_m$ so that it is equal to an integer multiple of the free spectral range (FSR): $f_m$=N·FSR, where N is a natural integer number higher than or equal to 1. For example, for a laser cavity 3 having a free spectral range of 180 MHz, it is for example chosen a modulation frequency $f_m$ equal to 360 MHz or 540 MHz. The frequency generator that controls the optical phase modulator is generally rather stable. In practice, the modulation frequency is of the order of a few hundreds of megahertz and the necessary accuracy on this modulation frequency is of the order of the megahertz, which is easily accessible with a current frequency generator. The first condition is easily fulfilled by adjusting the modulation frequency $f_m$. This modulation frequency $f_m$ generally requires no servo-control.

Moreover, the discrete wavelengths of the lines must be located in the gain band of the optical amplifier and preferably with a similar gain. Indeed, in the case where the lines correspond to very different gain values, a spurious FM-AM over-modulation is liable to occur. It is hence preferable that the lines are located in a relatively flat area of the gain band of the optical amplifier.

For example, in the case of an optical amplifier based on a Nd:YAG crystal, which is one of the amplifier materials having a narrow gain band, the lines are located in a spectral band of 20 to 30 GHz.

In the case of materials having a very high bandwidth, such as titanium-sapphire laser or an ytterbium laser, this additional condition is not limitative.

A technical difficulty consists in making the tuning between the wavelengths of the polychromatic continuous injection radiation 120 and certain longitudinal modes of the laser cavity 3.

For that purpose, the modulation frequency being fixed to a multiple of the free spectral range of the laser cavity, a second condition is to ensure the exact correspondence or the tuning between the discrete wavelength of one of the lines and a longitudinal mode of the laser cavity located inside the gain band of the optical amplifier. Now, this correspondence must be made with an accuracy better than about a tenth of the free spectral band, i.e. about 20 MHz, which imposes a strong constraint on the accuracy of wavelength adjustment of the polychromatic continuous injection radiation 120.

For example, in the case where the modulation depth m=1.4 radian, the matter is to tune the wavelength of the central line $\lambda_c$ corresponding to an optical frequency of the order of 300 THz to a longitudinal mode of the cavity laser with an accuracy of the order of 20 MHz, i.e. with an accuracy of the order of $10^{-7}$.

In an embodiment illustrated in FIG. 6, this tuning is made by modifying the wavelength $\lambda_c$ of the monochromatic continuous laser radiation 10 emitted by the injection source 11.

In an exemplary embodiment, the monochromatic injection source 11 is a laser diode. Advantage is taken of the thermo-optical properties of this type of laser diode. Indeed, a laser diode has generally an adiabatic chirp, denoted K, that allows slightly modifying the wavelength of emission when the supply current of the laser diode is modified, which also modifies the power of the laser diode. Hence, a very low modification of the power of a laser diode is sufficient to change the wavelength, with the required accuracy indicated in the application hereinabove. For example, let's consider a common single mode laser diode 1 operating about 10 mW and having an adiabatic chirp $\kappa \sim 10^{11}$ Hz/W. A power variation of the laser diode of the order of one percent corresponds to a wavelength variation of the monochromatic radiation of about 10 MHz.

In a variant, the electric current of a Peltier effect module that stabilizes the temperature of a pump diode is modified, so as to modify the thermal properties of the junction, which affect the wavelength of the monochromatic continuous laser radiation 10. The advantage of this variant is that the power of the laser diode 11 is not modified. However, in this variant, the wavelength change, due to a thermal effect, is not instantaneous.

After phase modulation of this monochromatic continuous laser radiation 10, the discrete lines are hence simultaneously offset so as to correspond to certain longitudinal modes of the laser cavity.

In FIG. 6, the injected laser advantageously comprises a feedback-loop servo-control system. This control system comprises a device for measuring a property of the output pulse 220. For example, the temporal shape of the output pulse 220 is measured. An electronic and/or digital system compares the measured temporal shape with a reference temporal shape. The servo-control has for object to ensure that the temporal shape of the output laser pulse 200 does not change with respect to the size as a function of time.

Preferably, the wavelength $\lambda_0$ of the monochromatic radiation is servo-controlled so as to ensure the stability of the tuning between the discrete wavelengths of the polychromatic radiation and certain longitudinal modes of the laser cavity. Potentially, the frequency of modulation of the optical phase modulator 20 can also be servo-controlled.

As an alternative, a feedback can be made over the length of the laser cavity 3. The distance between the ends 4 and 5 of the laser cavity indeed determines the wavelengths of the longitudinal modes of the laser cavity 3. This adjustment of the laser cavity length allows modifying the free spectral range and/or the wavelength of the longitudinal modes of the laser cavity.

However, it is generally more simple to servo-control a source or pump laser diode. In this case, the feedback loop of the laser cavity 3 is stopped.

Hence, a temporally continuous and polychromatic radiation is injected into the laser cavity 3, at discrete wavelengths, separated in optical frequency by at least the modulation frequency $f_m$. This phase modulation allows generating lines spaced apart by at least several hundreds of MHz, from 1 GHz or even 10 GHz to 15 GHz. This spacing between longitudinal modes is sufficient to avoid generating undesirable non-linear effects in the materials.

In an exemplary embodiment, the monochromatic injection source is a fibred laser diode. The phase modulator is a modulator with a waveguide integrated on a LiNbBO$_3$ substrate. The phase modulator is excited by a sinusoidal signal rf, with a modulation voltage of 5-6 volts, so as to obtain a modulation depth m=1.4 rad.

At the exit of the optical phase modulator 20, an optical fibre guides the polychromatic continuous radiation 120 towards the resonating cavity 3. At the exit of the optical fibre, a space collimator allows injecting the beam into the cavity. The beam has a diameter of 3-4 mm and is a little divergent.

A leak polarizer allows coupling the polychromatic continuous radiation in the resonating cavity 3.

The photons of the injection source are continuously injected into the laser cavity 3, with a suitable spectral spacing (condition 1) and at the suitable wavelength (condition 2).

After 10 to 20 round trips in the high gain cavity, a pulse goes out, with a power of the order of the MW.

Advantageously, a trigger of the Q-switch type is arranged in the laser cavity 3. The pulses of duration 6-7 ns exit at the triggering speed of the Q-switch, at a repetition rate of about 100 Hz.

The temporal shape of the output pulses is naturally given by the optical amplifying material 2.

FIG. 7A schematically shows an example of intensity spectrum of a non-injected mode cavity laser, the longitudinal modes of the laser cavity being shown in fine lines. FIG. 7A also shows the intensity spectrum of an injected mode cavity laser with phase modulation of a monochromatic injection source, this spectrum of the laser being consisted of discrete lines, shown in thick lines. In this illustrative example, it is observed that the line spacing of the phase-modulated injected mode cavity laser is equal to three times the free spectral range (FSR) of the laser cavity, the discrete lines being equidistant in frequency.

FIG. 7B schematically shows the intensity spectrum of a laser pulse at the exit of the laser cavity into which the polychromatic radiation generated by phase modulation has been injected. The output laser pulse is also multi-longitudinal mode and includes the plurality of discrete wavelengths injected by the phase-modulated injection source.

FIG. 7C schematically shows the temporal shape of an output laser pulse of the laser cavity. This temporal shape is reproducible from one pulse to the other and has no peaks of modulation.

More precisely, FIG. 8 shows as a function of time the temporal shape (or intensity as a function of time) $I_D$ of a laser pulse at the exit of an injected laser cavity with a phase modulation at a modulation frequency $f_m$ of 1.8 GHz, this modulation frequency being detuned with respect to the free spectral range of the cavity. The temporal shape of the detuned laser pulse $I_D$ has a strong modulation and peaks of intensity. As explained hereinabove, such peaks of intensity are undesirable when it is desired to avoid the Kerr-induced self-focusing.

FIG. 8 also shows the temporal shape of another laser pulse $I_M$ at the exit of the same injected laser cavity with a phase modulation at a modulation frequency of 1.83 GHz, corresponding to 10 times the FSR and the wavelength $\lambda_c$ corresponding to one of the modes of the laser cavity. Hence, this modulation frequency of 1.83 Ghz allows fulfilling the condition of tuning between the injected wavelengths and longitudinal modes of the cavity, this phase modulation being stabilized. A surprising effect is that the temporal shape of this pulse $I_M$ is stabilized, this temporal shape being devoid of peaks of intensity. This effect is surprising because it could be expected that the phase modulation generates an over-modulation of the temporal shape of the pulse as in the case of the detuned modulation at 1.8 GHz.

The laser pulse 220 at the exit of a phase-modulated and stabilized injected laser shows:
 a spectral distribution of energy over several lines corresponding to longitudinal modes of the laser cavity;
 a stable temporal shape, without peaks of over-modulation; and
 an intensity stable from one pulse to another pulse.

A high-energy laser pulse 220 having the properties mentioned hereinabove allows reducing the undesirable non-linear effects such as in particular the Kerr-induced self-focusing of the laser pulse and the stimulated Brillouin scattering in a material exposed to this laser pulse. Indeed, on the one hand, the cancellation of the peaks of intensity in the temporal profile of each pulse allows cancelling the Kerr effect. On the other hand, the spectral distribution of multimode energy allows reducing the Brillouin scattering effect.

The phase modulation of the injection source has several advantages. This phase modulation does not limit the number of spectral lines of the polychromatic injection radiation. By increasing the number of spectral lines, it is hence possible to reduce the power spectral density of the pulses and to better cancel the non-linear Brillouin scattering effects. In order to reduce and to cancel any Brillouin effect, the modulation frequency $f_m$ is in practice chosen higher than or equal to the reverse of the Brillouin characteristic time.

In an example of application: 1/t Brillouin~500 MHz.

A spacing between lines≥~500 MHz is chosen.

On the other hand, in applications requiring a far higher pulse power, it is sufficient to modify the modulation depth to increase the number of spectral lines.

The invention may find applications in the field of laser-material interactions and in particular in the tests of damaging of materials exposed to high-energy laser pulses.

The invention may also find applications in the field of LIDARs to generate polychromatic laser pulses having a stable-over-time and reproducible intensity.

The invention claimed is:

1. An injected laser comprising:
 an optical amplifying medium arranged inside a triggered laser cavity, the optical amplifying medium having a spectral amplification band,
 the laser cavity having a free spectral range (FSR) lower than the spectral bandwidth of the optical amplifying medium, the laser cavity determining longitudinal resonating modes spectrally separated by the free spectral range (FSR),
 wherein:
 the injected laser comprises a single injection source adapted to emit a monochromatic continuous laser radiation,
 the injected laser comprises an optical phase-modulation device arranged between the injection source and the laser cavity, the optical phase-modulation device being configured to periodically modulate as a function of time a phase of the monochromatic continuous laser radiation at a modulation frequency ($f_m$) equal to a natural integer multiple of the free spectral range (FSR) of the laser cavity, so that the phase-modulated injection source generates a polychromatic injection radiation having a plurality of discrete wavelengths located inside the gain band of the optical amplifier, the plurality of discrete wavelengths being tuned to a plurality of longitudinal resonance modes of the laser cavity,
 the laser cavity and the optical amplifier medium being adapted to receive said polychromatic injection radiation and to generate a multi-longitudinal mode laser pulse, and
 the injection source is a fibred laser diode emitting a monochromatic continuous laser radiation at a wavelength ($\lambda_c$) of 1064 nm, the optical phase-modulation device comprises an optical modulator with a waveguide integrated on a lithium niobate substrate, the optical amplifying medium is a neodymium-YAG crystal and the triggered laser cavity comprises a Q-switch triggering device.

2. The injected laser according to claim 1, wherein the optical phase-modulation device is configured to sinusoidally modulate the phase of the monochromatic continuous laser radiation as a function of time with a modulation depth m, so that the polychromatic injection radiation comprises about 2m+1 discrete wavelengths.

3. The injected laser according to claim 2, wherein the modulation depth (m) is equal to about 1.4 radians so that the polychromatic injection radiation comprises three discrete wavelengths.

4. The injected laser according to claim 1, comprising a feedback-loop servo-control system comprising a measurement device adapted to measure a signal representative of a multi-longitudinal mode laser pulse at the exit of the laser cavity and a control device to modify, as a function of the measured signal, at least one parameter of operation of the injection source and/or of the optical phase-modulation device and/or of the laser cavity.

5. The injected laser according to claim 4, wherein the injection source comprises a laser diode supplied with an electric current source and wherein the feedback system comprises a device adapted to modify the power of the electric current source supplying the laser diode, so as to modify the wavelength of the monochromatic continuous laser radiation as a function of the signal measured.

6. The injected laser according to claim 4, wherein the feedback system comprises a device adapted to modify the modulation frequency ($f_m$) and/or the modulation depth (m) of the optical phase-modulation device as a function of the signal measured.

7. The injected laser according to claim 5, wherein the feedback system comprises a device adapted to modify the modulation frequency ($f_m$) and/or the modulation depth (m) of the optical phase-modulation device as a function of the signal measured.

8. The injected laser according to claim 1, wherein the optical amplifier medium is chosen among a material having a titanium-, ytterbium- or neodymium-doped matrix.

9. The injected laser according to claim 2, wherein the optical amplifier medium is chosen among a material having a titanium-, ytterbium- or neodymium-doped matrix.

10. The injected laser according to claim 3, wherein the optical amplifier medium is chosen among a material having a titanium-, ytterbium- or neodymium-doped matrix.

11. The injected laser according to claim 4, wherein the optical amplifier medium is chosen among a material having a titanium-, ytterbium- or neodymium-doped matrix.

12. The injected laser according to claim 5, wherein the optical amplifier medium is chosen among a material having a titanium-, ytterbium- or neodymium-doped matrix.

13. The injected laser according to claim 6, wherein the optical amplifier medium is chosen among a material having a titanium-, ytterbium- or neodymium-doped matrix.

14. A method for generating multi-longitudinal mode laser pulses comprising the following steps:
   emission of a monochromatic continuous laser radiation by a fibred laser diode emitting a monochromatic continuous laser radiation at a wavelength ($\lambda_c$) of 1064 nm,
   periodic modulation, as a function of time, at a modulation frequency ($f_m$), of a phase of the monochromatic continuous laser radiation using an optical modulator with a waveguide integrated on a lithium niobate substrate so as to generate a polychromatic injection radiation having a plurality of discrete wavelengths,
   injection of the polychromatic injection radiation in a triggered laser cavity comprising a Q-switched triggering device and an optical amplifying medium arranged inside the laser cavity, the optical amplifying medium being a neodymium-YAG crystal, the optical amplifying medium having a spectral amplification band, and the laser cavity having a free spectral band (FSR) lower than the spectral bandwidth of the optical amplifying medium, the modulation frequency ($f_m$) being equal to a natural integer multiple of the free spectral band (FSR) of the laser cavity, so that the plurality of discrete wavelengths of the polychromatic injection radiation is tuned over a plurality of longitudinal resonance modes of the laser cavity located inside the gain band of the optical amplifier,
   amplification of the polychromatic injection radiation in the triggered laser cavity, and
   triggering of the emission of a multi-longitudinal mode laser pulse.

15. An injected laser comprising:
   an optical amplifying medium arranged inside a triggered laser cavity, the optical amplifying medium having a spectral amplification band,
   the laser cavity having a free spectral range (FSR) lower than the spectral bandwidth of the optical amplifying medium, the laser cavity determining longitudinal resonating modes spectrally separated by the free spectral range (FSR),
   wherein:
   the injected laser comprises a single injection source adapted to emit a monochromatic continuous laser radiation,
   the injected laser comprises an optical phase-modulation device arranged between the injection source and the laser cavity, the optical phase-modulation device being configured to periodically modulate as a function of time a phase of the monochromatic continuous laser radiation at a modulation frequency ($f_m$) equal to a natural integer multiple of the free spectral range (FSR) of the laser cavity, so that the phase-modulated injection source generates a polychromatic injection radiation having a plurality of discrete wavelengths located inside the gain band of the optical amplifier, the plurality of discrete wavelengths being tuned to a plurality of longitudinal resonance modes of the laser cavity,
   the laser cavity and the optical amplifier medium being adapted to receive said polychromatic injection radiation and to generate a multi-longitudinal mode laser pulse, and
   the optical phase-modulation device being configured to sinusoidally modulate the phase of the monochromatic continuous laser radiation as a function of time with a modulation depth m, so that the polychromatic injection radiation comprises about 2m+1 discrete wavelengths, and
   the modulation depth m is equal to about 1.4 radians so that the polychromatic injection radiation comprises three discrete wavelengths.

16. The injected laser according to claim 15, wherein the optical amplifier medium is chosen among a material having a titanium-, ytterbium- or neodymium-doped matrix.

* * * * *